US011688729B2

(12) United States Patent
Elsherbini et al.

(10) Patent No.: US 11,688,729 B2
(45) Date of Patent: Jun. 27, 2023

(54) INTEGRATED THIN FILM CAPACITORS ON A GLASS CORE SUBSTRATE

(71) Applicant: Intel Corporation, Santa Clara, CA (US)

(72) Inventors: Adel Elsherbini, Chandler, AZ (US); Krishna Bharath, Chandler, AZ (US); Mathew Manusharow, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 1036 days.

(21) Appl. No.: 16/030,196

(22) Filed: Jul. 9, 2018

(65) Prior Publication Data

US 2020/0013770 A1 Jan. 9, 2020

(51) Int. Cl.
*H01L 27/01* (2006.01)
*H01L 23/498* (2006.01)
*H01L 49/02* (2006.01)

(52) U.S. Cl.
CPC ...... *H01L 27/016* (2013.01); *H01L 23/49816* (2013.01); *H01L 23/49827* (2013.01); *H01L 28/87* (2013.01); *H01L 28/91* (2013.01)

(58) Field of Classification Search
CPC ............... H01L 27/016; H01L 23/5223; H01L 2924/19011; H01L 2924/19015; H01L 2924/19041; H01L 2924/19102; H01L 2924/19103; H01L 2924/19106; H01L 28/86–87; H01L 28/90–91; H01G 4/33; H01G 4/38; H01G 4/40
See application file for complete search history.

(56) References Cited

U.S. PATENT DOCUMENTS

| | | | | |
|---|---|---|---|---|
| 6,214,445 B1 * | 4/2001 | Kanbe | ................. | H05K 1/162 257/E23.079 |
| 2004/0087058 A1 * | 5/2004 | Ooi | ................. | H01L 21/6835 257/532 |
| 2004/0104451 A1 * | 6/2004 | Ooi | ................. | H01L 24/05 257/532 |
| 2004/0238941 A1 * | 12/2004 | Satoh | ................. | H01L 23/49816 257/725 |
| 2005/0207091 A1 * | 9/2005 | Kambe | ................. | H05K 1/185 361/301.1 |
| 2007/0275525 A1 * | 11/2007 | Das | ................. | H01L 27/12 257/E21.008 |

(Continued)

*Primary Examiner* — Phat X Cao
*Assistant Examiner* — William Henry Anderson
(74) *Attorney, Agent, or Firm* — Essential Patents Group, LLP (57) ABSTRACT

An apparatus is provided which comprises: one or more first conductive contacts on a first substrate surface, one or more second conductive contacts on a second substrate surface opposite the first substrate surface, a core layer comprising glass between the first and the second substrate surfaces, and one or more thin film capacitors on the glass core conductively coupled with one of the first conductive contacts and one of the second conductive contacts, wherein the thin film capacitor comprises a first metal layer on a surface of the glass core, a thin film dielectric material on a surface of the first metal layer, and a second metal layer on a surface of the thin film dielectric material. Other embodiments are also disclosed and claimed.

12 Claims, 8 Drawing Sheets

(56) References Cited

U.S. PATENT DOCUMENTS

| | | | | |
|---|---|---|---|---|
| 2008/0121417 A1* | 5/2008 | Fan | ........................ | H05K 1/162 |
| | | | | 174/260 |
| 2009/0284944 A1* | 11/2009 | Palanduz | .............. | H01L 27/016 |
| | | | | 361/784 |
| 2019/0287893 A1* | 9/2019 | Mizutani | ............... | H01L 23/481 |

\* cited by examiner

INTEGRATED THIN FILM CAPACITORS ON A GLASS CORE SUBSTRATE

BACKGROUND

Computing platforms, such as smart phones or tablets, for example, may include many discrete capacitors as part of input/output signals, power delivery, or other circuits. Conventionally these discrete components are manufactured using silicon technology and subsequently packaged and assembled as one or more discrete components on a motherboard or integrated circuit package, for example. This approach requires expensive silicon-based manufacturing, adds significant z-height to the package or board, and requires assembly of the discrete capacitors. Alternatively, premanufactured sheets of thin film capacitors (TFCs) may be laminated onto package substrates. However, large areas of the substrate outside of the die shadow would need to be drilled through to allow for I/O through holes, rendering these areas less effective and adding additional cost. Therefore, there is a need for package integrated capacitors that address these issues.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Integrated thin film capacitors on a glass core substrate are generally presented. In this regard, embodiments of the present disclosure enable in situ formation of space efficient capacitors. One skilled in the art would appreciate that these thin film capacitors may be made very thin due to the smoothness of a glass core and may be formed more efficiently due to the compatibility of a glass core with high temperature annealing of high k ceramic dielectrics. Additionally, the thin film capacitors described herein may enable miniaturization of components and thereby enable integration of more components and enhanced features.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," and the like in the description and in the claims, if any, are used for descriptive purposes and not necessarily for describing permanent relative positions.

Figure 1:
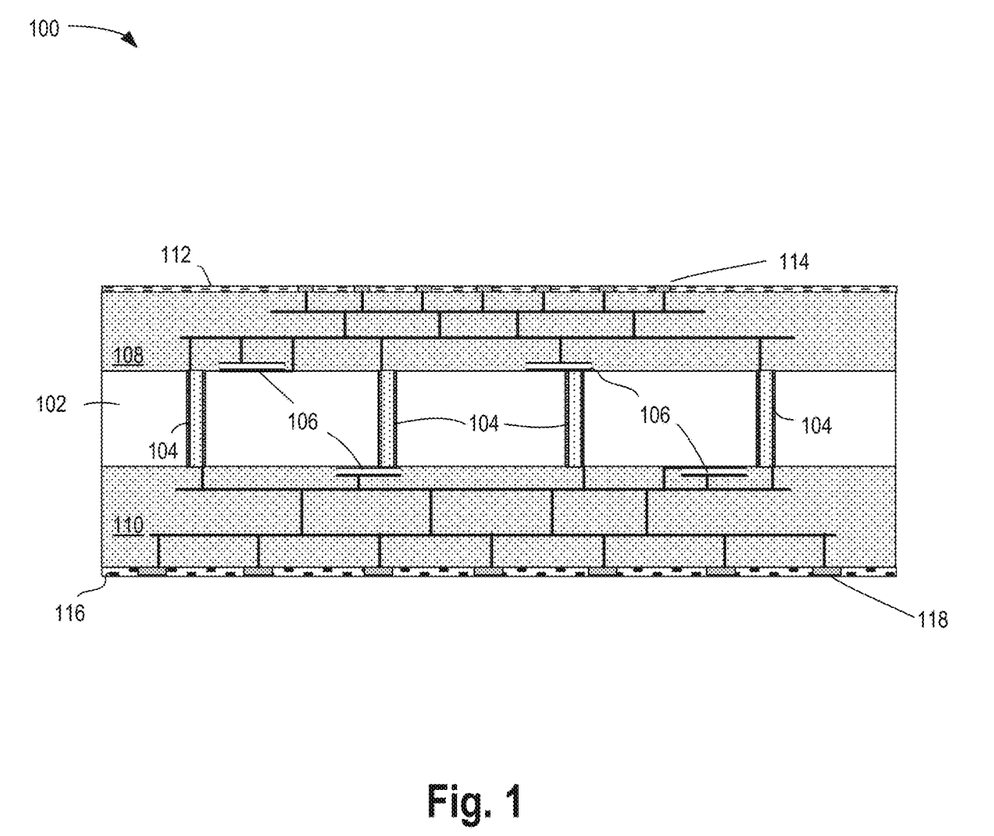
FIG. 1 illustrates a cross-sectional view of an example package substrate with integrated thin film capacitors on a glass core substrate, according to some embodiments.

FIG. 1 illustrates a cross-sectional view of an example package substrate with integrated thin film capacitors on a glass core substrate, according to some embodiments. As shown, substrate 100 includes glass core 102, vias 104, thin film capacitors 106, upper interconnect layers 108, lower interconnect layers 110, upper solder resist layer 112, upper conductive contacts 114, lower solder resist layer 116, and lower conductive contacts 118. In some embodiments, substrate 100 may include additional layers and integrate additional components. While shown as including two thin film capacitors 106 on either side of glass core 102, more or fewer thin film capacitors may be integrated on either side.

In some embodiments, glass core 102 may be a silicate (for example silicon dioxide-based) glass that may be tempered or treated. In some embodiments, glass core 102 is a non-crystalline amorphous solid. In some embodiments, glass core 102 may be designed to be thin and damage-resistant. In some embodiments, glass core 102 is pre-formed and not deposited in-situ using a traditional deposition technique, such as atomic layer deposition or chemical vapor deposition, for example. In some embodiments, glass core 102 is made by fusing liquid sand with soda ash (sodium carbonate), limestone (calcium carbonate), and/or other ingredients and cooling rapidly. In some embodiments, glass core 102 may contain boron oxide for improved thermal resistance. In some embodiments, glass core 102 may contain lead oxide for improved ease of cutting. In some embodiments, glass core 102 may contain a sandwich or laminate of multiple layers of glass that are plastic bonded together. In some embodiments, glass core 102 is transparent or translucent. In some embodiments, glass core 102 may have a thickness of between about 100 and 1000 microns (1 mm). Glass core 102 may have an inherently low surface roughness and a high temperature tolerance, allowing for uniform thin film depositions that require annealing. In some embodiments, glass core 102 may have a relatively low coefficient of thermal expansion (CTE). In some embodiments, glass core 102 may also contain ceramic material. In some embodiments, the thermal expansion of glass core 102 is controlled by firing to create crystalline species that will influence the overall expansion of glass core 102 in the desired direction. For example, glass core 102 may include crystalline additives that tend to thermally expand longitudinally, as opposed to laterally. In some embodiments, the formulation of glass core 102 employs materials delivering particles of the desired expansion to the matrix. In some embodiments, glass core 102 may include a glaze (not shown) that may have the effect of reducing thermal expansion. Vias 104 may be drilled through glass core 102 by any known method, including, for example, laser drilling and plating. Vias 104 may also be lined and/or filled with additional dielectric material to provide electrical insulation.

Thin film capacitors 106 may be formed by thin film deposition techniques, such as sputtering, atomic layer deposition, chemical vapor deposition, etc. In some embodiments, thin film capacitors 106 may include material layers as described in greater detail hereinafter, for example in reference to FIGS. 2A-2F. While shown as being present on both side of glass core 102, in some embodiments, thin film capacitors 106 may be present on only one side of glass core 102. In some embodiments, thin film capacitors 106 may be any type of metal-insulator-metal (MIM) capacitors.

In some embodiments, upper interconnect layers 108 and lower interconnect layers 110 may include multiple layers of interlayer dielectric, such as a doped silicon dioxide, for example, along with metal wires to route electrodes of thin film capacitors 106 to upper conductive contacts 114 and lower conductive contacts 118, respectively. In some embodiments, upper interconnect layers 108 and/or lower interconnect layers 110 may fan-in or fan-out a contact pitch from one side of substrate 100 to the other.

Figure 2A:
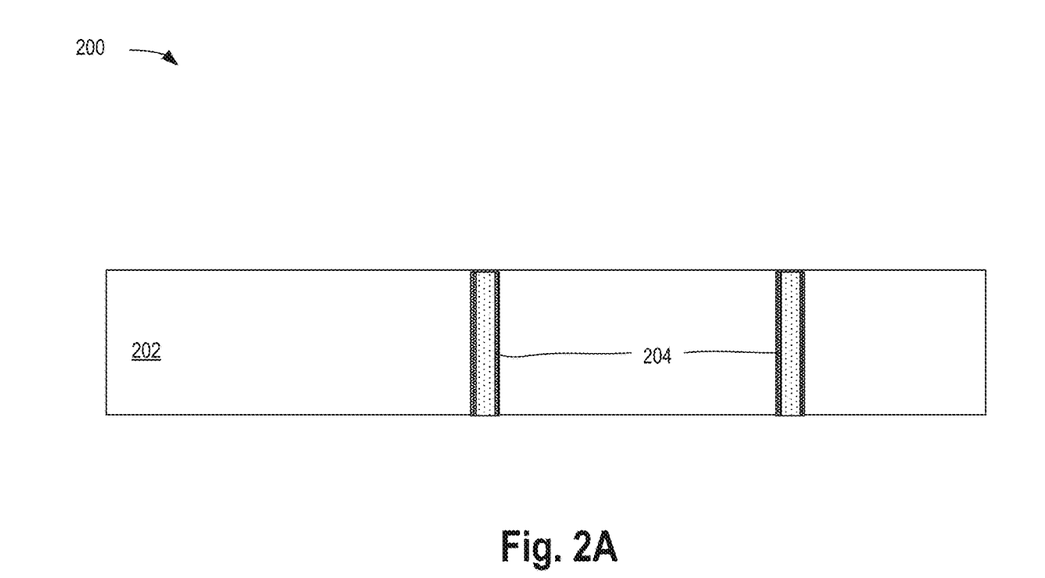
FIGS. 2A-2F illustrate cross-sectional views of manufacturing steps of forming integrated thin film capacitors on a glass core substrate, according to some embodiments.

FIGS. 2A-2F illustrate cross-sectional views of manufacturing steps of forming integrated thin film capacitors on a glass core substrate, according to some embodiments. As shown in FIG. 2A, assembly 200 includes glass core 202 and vias 204. In some embodiments, vias 204 may include conductive material, such as metal, with additional insulative material surrounding (and/or surrounded by) the conductive material. In some embodiments, vias 204 may be formed through glass core 202 during a later processing step. In some embodiments, glass core 202 may be a preformed piece of glass including any of the properties mentioned previously, for example in reference to FIG. 1. While shown as including two vias 204, any number of vias 204 may be present.

Figure 2B:
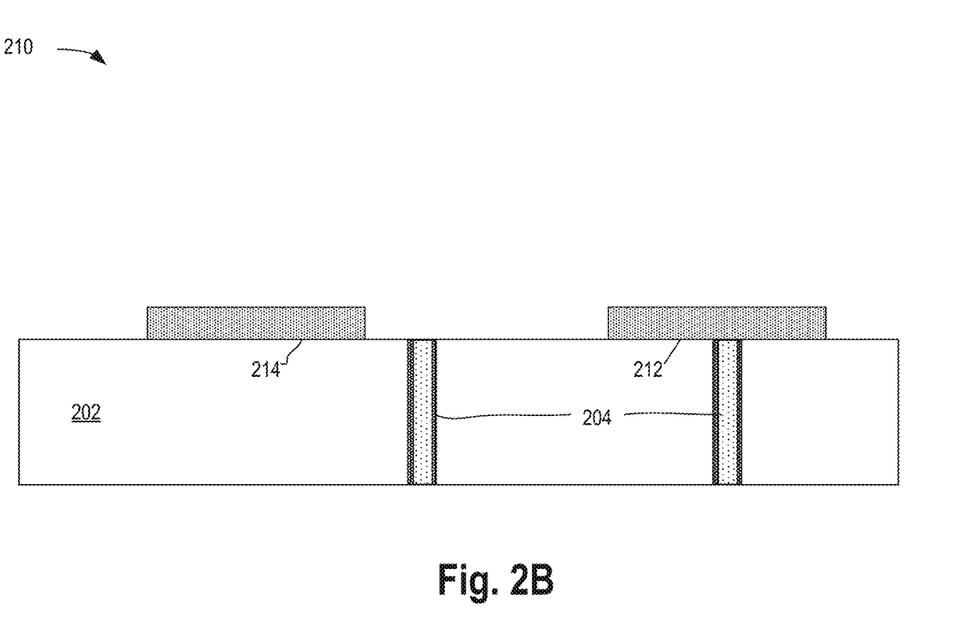

FIG. 2B shows assembly 210, which may include metal layers 212 and 214. In some embodiments, metal layer 212 may be formed in contact with a via 204, while metal layer 214 may be formed separate from any via 204. In some embodiments, metal layers 212 and 214 include metal that can withstand a subsequent high temperature anneal process, such as nickel, tungsten, titanium, or chromium, for example. In some embodiments, metal layers 212 and 214 may be formed through a multi-step lithographic patterning process. Metal layers 212 and 214 may have substantially equal or substantially different widths. In some embodiments, metal layers 212 and 214 may have a thickness of less than about 1um.

Figure 2C:
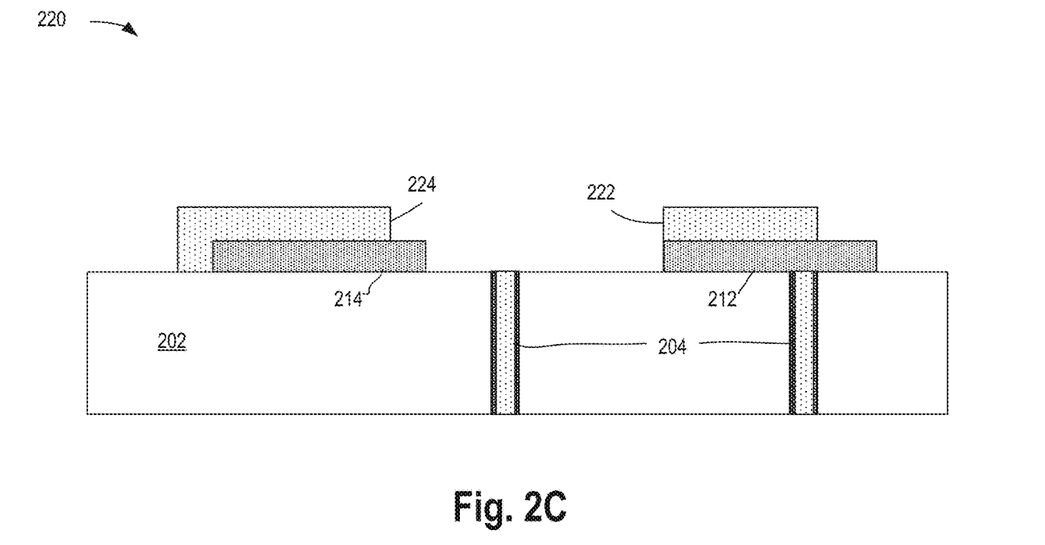

As shown in FIG. 2C, assembly 220 includes thin film dielectric layers 222 and 224, formed over metal layers 212 and 214, respectively. In some embodiments, thin film dielectric layers 222 and 224 are a ferroelectric material including, but not limited to a ceramic, such as $(BaSr)TiO_3$ (BST). In some embodiments, thin film dielectric layers 222 and 224 are a resistive material including, but not limited to, titanium or titanium nitride, for example. In some embodiments, thin film dielectric layers 222 and 224 are deposited by a paste printing process or sputter deposition, however other deposition or formation methods may be used. In some embodiments, thin film dielectric layers 222 and 224 have a thickness of less than about 1 um. In some embodiments, thin film dielectric layers 222 and 224 require high temperature annealing, which may take place before or after additional layers are deposited. In some embodiments, thin film dielectric layer 224 extends over one side of metal layer 214 and contacts a surface of glass core 202. In some embodiments, metal layers 212 and 214 extend further in one direction that thin film dielectric layers 222 and 224, respectively.

Figure 2D:
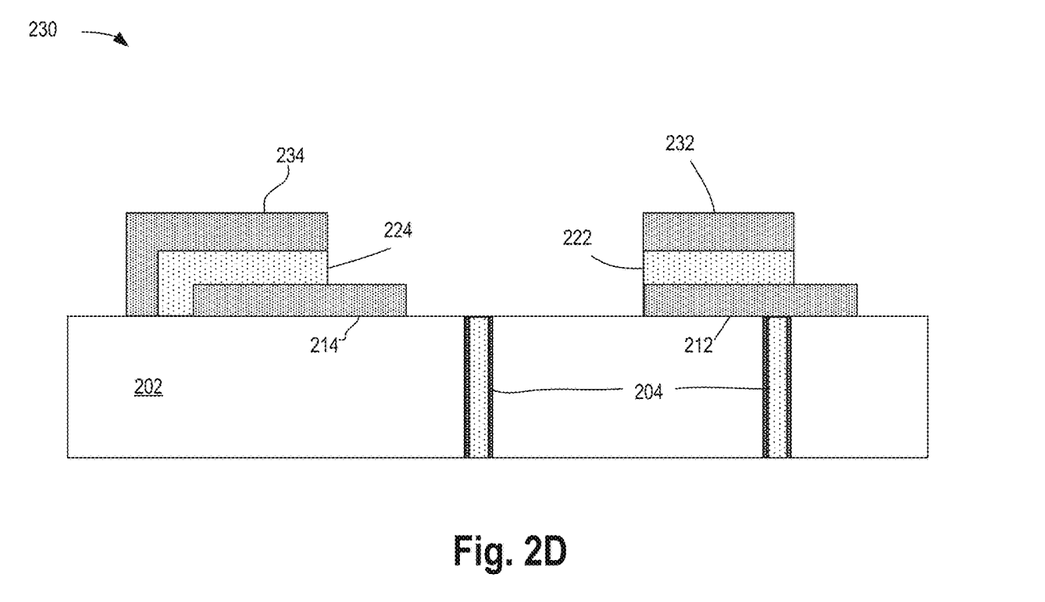

Turning now to FIG. 2D, assembly 230 may include metal layers 232 and 234. In some embodiments, metal layers 232 and 234 may be a same metal as or a different metal from metal layers 212 and 214. In some embodiments, to the extent annealing of thin film dielectric layers 222 and 224 has been completed, metal layers 232 and 234 may be copper or another metal that might not be compatible with a high temperature anneal. In some embodiments, metal layer 234 extends over one side of thin film dielectric layer 224 and contacts a surface of glass core 202. In some embodiments, metal layer 232 is coextensive with thin film dielectric layer 222.

Figure 2E:
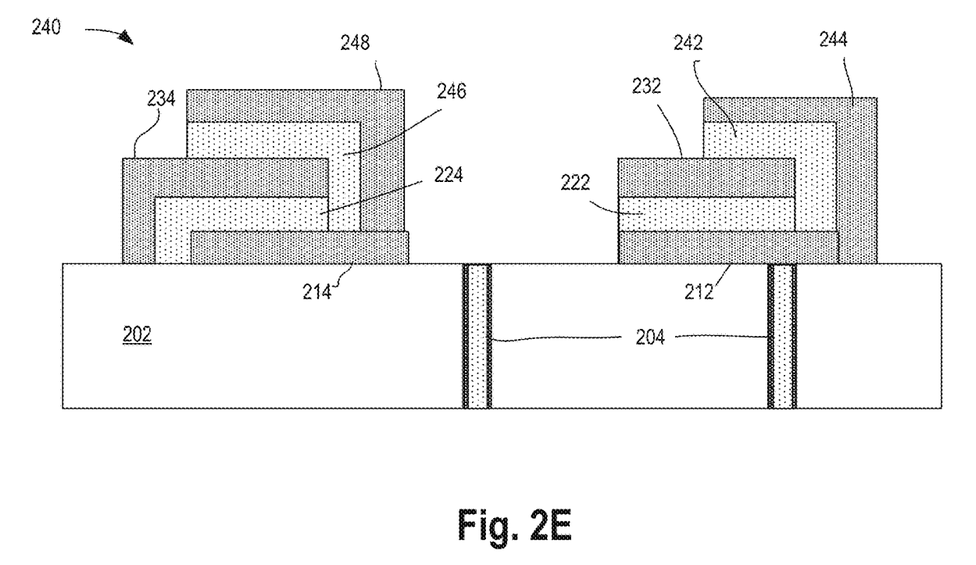

FIG. 2E shows assembly 240, which may include thin film dielectric layers 242 and 246 and metal layers 244 and 248. In some embodiments, any number of thin film dielectric and metal layers may be stacked on top of each other. In some embodiments, thin film dielectric layers 242 and 246 may have a same composition and thickness as thin film dielectric layers 222 and 224, respectively, while in other embodiments there may be variations in composition and/or thickness. In some embodiments, metal layers 244 and 248 may have a same composition and thickness as metal layers 212 and 214, respectively, while in other embodiments there may be variations in composition and/or thickness.

Figure 2F:
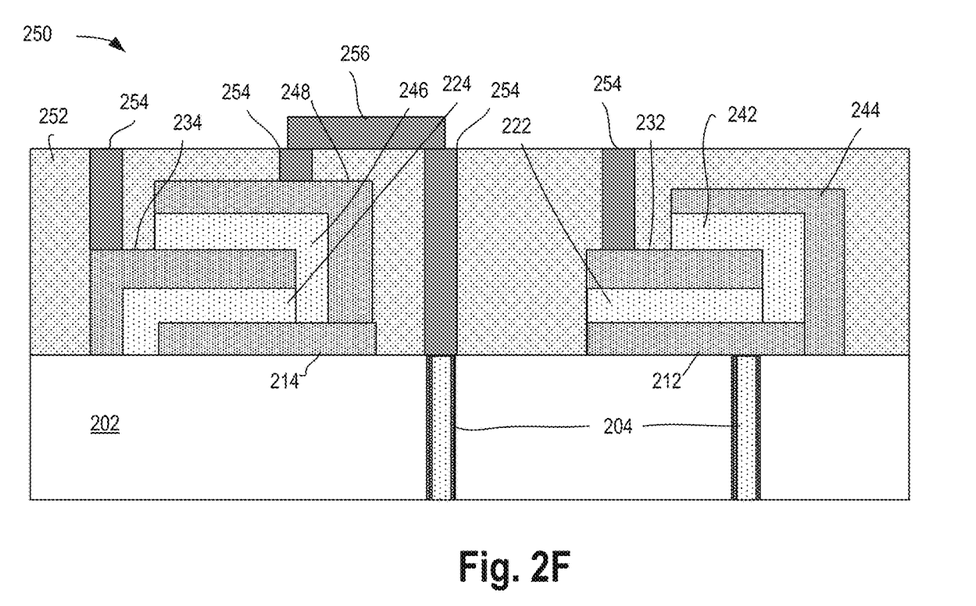

As shown in FIG. 2F, for assembly 250 interlayer dielectric 252, vertical wires 254, and horizontal wire 256 may have been deposited. In some embodiments, interlayer dielectric 252 may insulate and cover each of the metal and thin film dielectric layers. In some embodiments, interlayer dielectric 252 may be a dielectric material deposited by any known technique, including, but not limited to, atomic layer deposition or chemical vapor deposition. In other embodiments, interlayer dielectric 252 may be a liquid or preformed semi-solid film, such as a resin, that is applied over the surface of glass core 202. In some embodiments, interlayer dielectric 252 may contain silicon dioxide, but may differ from glass core 202 in composition, for example, interlayer dielectric 252 might not include additives (for example, those mentioned above in reference to FIG. 1) that are included in glass core 202. In some embodiments, interlayer dielectric 252 may differ from glass core 202 in crystalline structure, for example interlayer dielectric 252 may be a crystalline solid, while glass core 202 may be a non-crystalline amorphous solid.

In some embodiments, drilling or patterning may expose portions of metal layers 232, 234, and 248, which are coupled with vertical wires 254, which may be copper or another metal. In some embodiments, horizontal wire 256 may electrically couple two vertical wires 254 to form an electrical connection between a via 204 and metal layers 214 and 248, for example. In some embodiments, vertical wires 254 may be referred to as 'vias' and may be similar to vias 204, while in other embodiments vertical wires 254 differ from vias 204 in structure, for example, vertical wires 254 may not include additional insulation layers, while vias 204 may include additional insulation layers. While shown as having comparable widths, the figures, including FIG. 2F, are not drawn to scale, and vertical wires 254 and vias 204 may have substantially different widths. In some embodiments, vertical wires 254 may have a width that is less than one half the width of vias 204. Additional interconnect layers with interlayer dielectric and vertical and horizontal wires may be necessary to complete the substrate.

Figure 3:
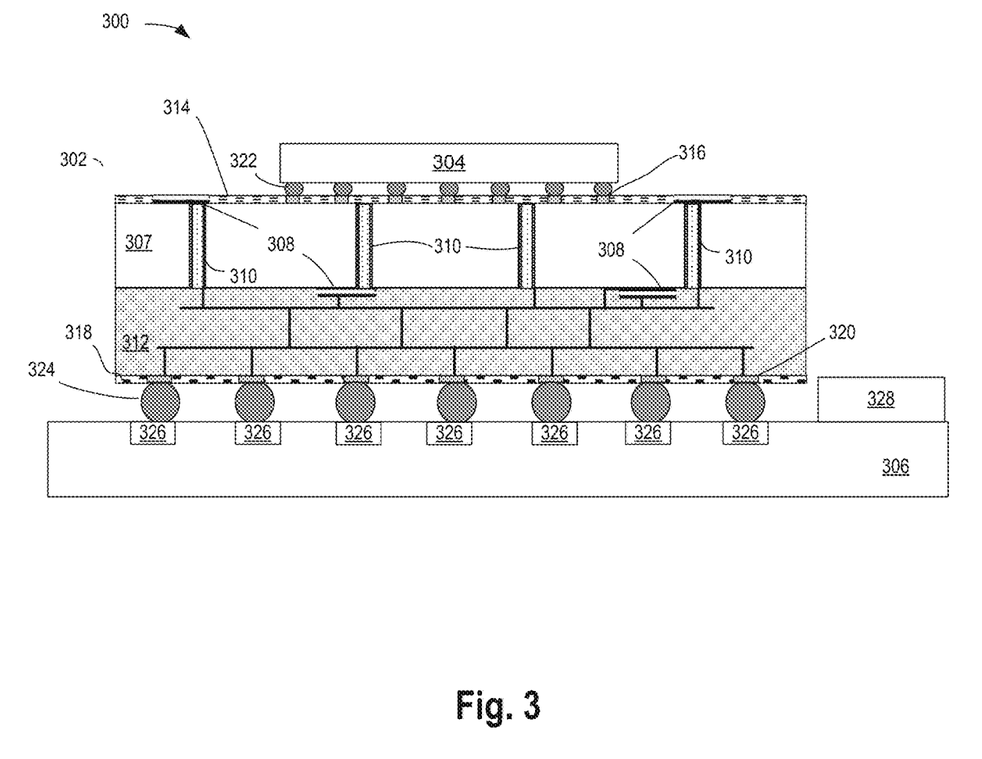
FIG. 3 illustrates a cross-sectional view of an example package with integrated thin film capacitors on a glass core substrate, according to some embodiments.

FIG. 3 illustrates a cross-sectional view of an example package with integrated thin film capacitors on a glass core substrate, according to some embodiments. As shown, assembly 300 includes package substrate 302, integrated circuit device 304, system board 306, glass core 307, thin film capacitors 308, vias 310, lower build-up layers 312, upper solder resist layer 314, upper conductive contacts 316, lower solder resist layer 318, lower conductive contacts 320, die bumps 322, solder balls 324, board pads 326, and board component 328.

Package substrate 302 may incorporate elements previously discussed in reference to prior figures. For example, thin film capacitors 308 may have properties discussed in reference to FIGS. 2A-2F. As shown, package substrate 302 may include build-up layers on one side of glass core 307, i.e. lower build-up layers 312. As such one or more thin film capacitors 308 may be coplanar with upper solder resist layer 314 and upper conductive contacts 316.

Integrated circuit device 304 may represent any type of device, including, but not limited to a processor, a controller, an SOC, or a transceiver. In some embodiments, integrated circuit device 304 is coupled with package substrate 302 through die bumps 322 being soldered to upper conductive contacts 316, however other conductive couplings may be used.

In some embodiments, solder balls 324 may be formed on lower conductive contacts 320, thereby allowing package substrate 302 to be soldered to system board 306 through board pads 326. System board 306 may also incorporate board component 328, which may represent any type of active or passive system components, such as memory devices, voltage regulators, I/O interfaces, etc.

Figure 4:
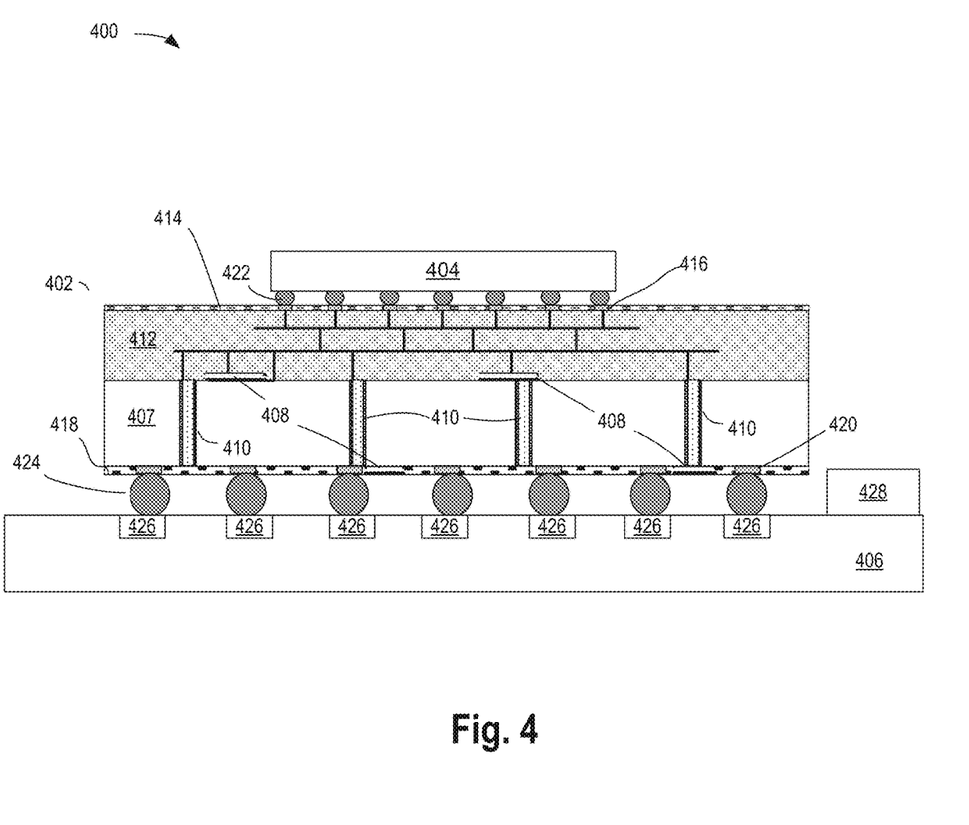
FIG. 4 illustrates a cross-sectional view of an example package with integrated thin film capacitors on a glass core substrate, according to some embodiments.

FIG. 4 illustrates a cross-sectional view of an example package with integrated thin film capacitors on a glass core substrate, according to some embodiments. As shown, assembly 400 includes package substrate 402, integrated circuit device 404, system board 406, glass core 407, thin film capacitors 408, vias 410, upper build-up layers 412, upper solder resist layer 414, upper conductive contacts 416, lower solder resist layer 418, lower conductive contacts 420, die bumps 422, solder balls 424, board pads 426, and board component 428.

Package substrate 402 may incorporate elements previously discussed in reference to prior figures. For example, thin film capacitors 408 may have properties discussed in reference to FIGS. 2A-2F. As shown, package substrate 402 may include build-up layers on one side of glass core 307, i.e. upper build-up layers 312. As such one or more thin film capacitors 408 may be coplanar with lower solder resist layer 418 and lower conductive contacts 420.

Figure 5:
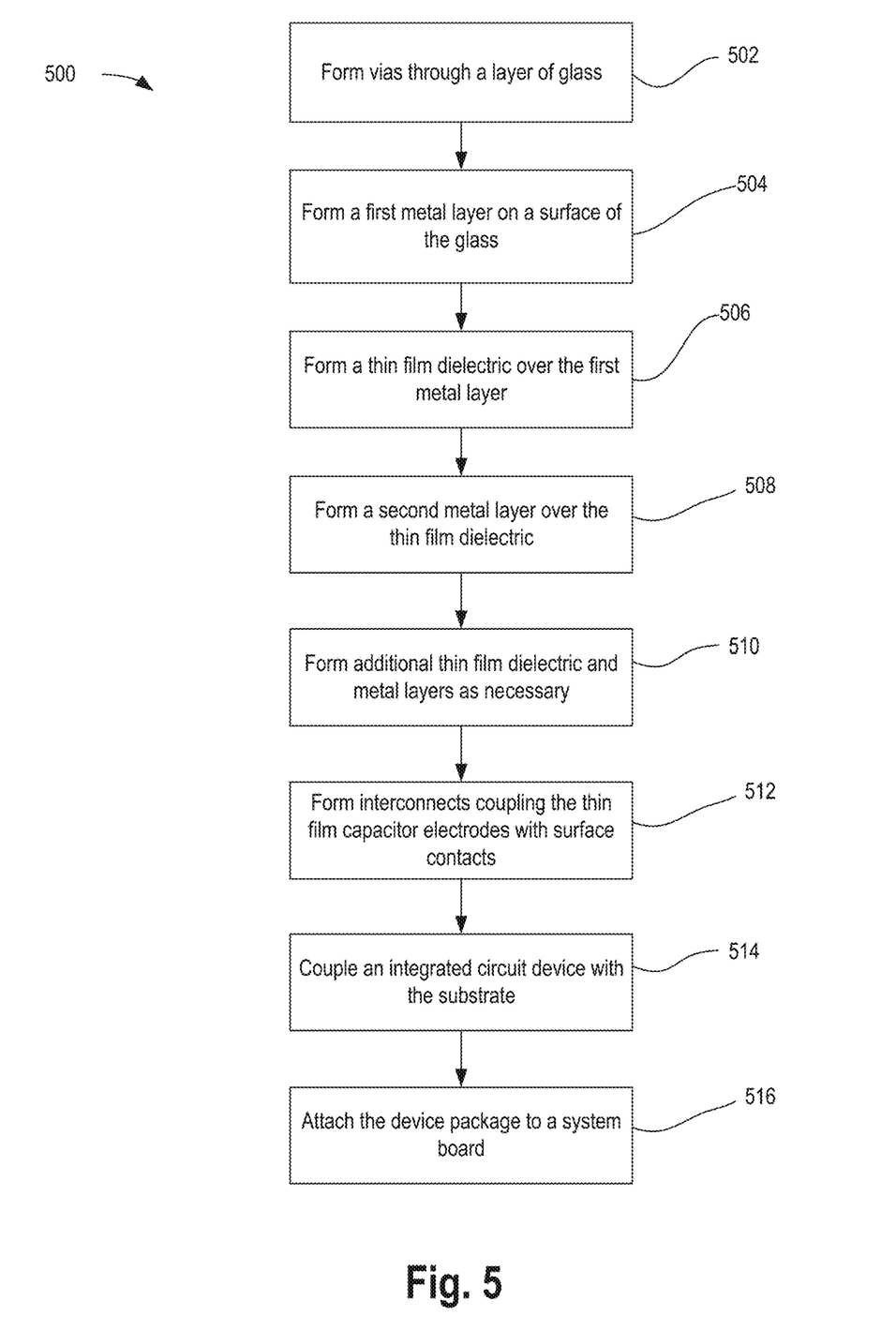
FIG. 5 illustrates a flowchart of a method of forming integrated thin film capacitors on a glass core substrate, in accordance with some embodiments.

FIG. 5 illustrates a flowchart of a method of forming integrated thin film capacitors on a glass core substrate, in accordance with some embodiments. Although the blocks in the flowchart with reference to FIG. 5 are shown in a particular order, the order of the actions can be modified. Thus, the illustrated embodiments can be performed in a different order, and some actions/blocks may be performed in parallel. Some of the blocks and/or operations listed in FIG. 5 are optional in accordance with certain embodiments. The numbering of the blocks presented is for the sake of clarity and is not intended to prescribe an order of operations in which the various blocks must occur. Additionally, operations from the various flows may be utilized in a variety of combinations.

Method 500 begins with forming (502) vias through a layer of glass. In some embodiments, such as assembly 200, vias 204 may be drilled and plated within glass core 202, which may be tempered or treated glass. Next, a first metal layer is formed (504) on a surface of the glass. In some embodiments, such as assembly 210, a metal layer 212 may be formed in contact with a via 204, while a metal layer 214 may be formed out of contact with a via 204.

Then, a thin film dielectric may be formed (506) over the first metal layer. In some embodiments, such as assembly 220, thin film dielectric layer 222 may be a ceramic paste that is printed flush with one edge of metal layer 212, but less extensive in at least one direction. In some embodiments, thin film dielectric layer 224 may extend beyond metal layer 214 in at least one direction and contact a surface of glass core 202. Next, a second metal layer is formed (508) over the thin film dielectric. In some embodiments, such as assembly 230, metal layer 232 may be co-extensive with thin film dielectric layer 222, while metal layer 234 may extend beyond thin film dielectric layer 224 in at least one direction and contact a surface of glass core 202.

The method continues, in some embodiments, with forming (510) additional thin film dielectric and metal layers as necessary. In some embodiments, such as assembly 240, additional thin film dielectric layers 242 and 246, and metal layers 244 and 248 may be formed as shown or in other potential arrangements. In some embodiments, the glass core with the thin film capacitors are annealed at this point, to the extent a ceramic dielectric is used that requires annealing. Next, interconnects are formed (512) coupling the thin film capacitor electrodes with surface contacts. In some embodiments, such as assembly 300, lower build-up layers 312 may couple lower conductive contacts 320 with thin film capacitors 308 and vias 310, while in other embodiments, such as assembly 400, upper build-up layers 412 may couple upper conductive contacts 416 with thin film capacitors 408 and vias 410. In other embodiments, such as substrate 100, both upper and lower build-up layers may be present.

Next, an integrated circuit device may be coupled (514) with the package substrate. In some embodiments, an integrated circuit device, such as device 304, may have microbumps soldered to a package substrate 302. Finally, the device package may be attached (516) to a system board. In some embodiments, solder bumps, such as solder bumps 324 may be formed on package substrate 302, allowing package substrate 302 to be soldered to system board 306.

Figure 6:
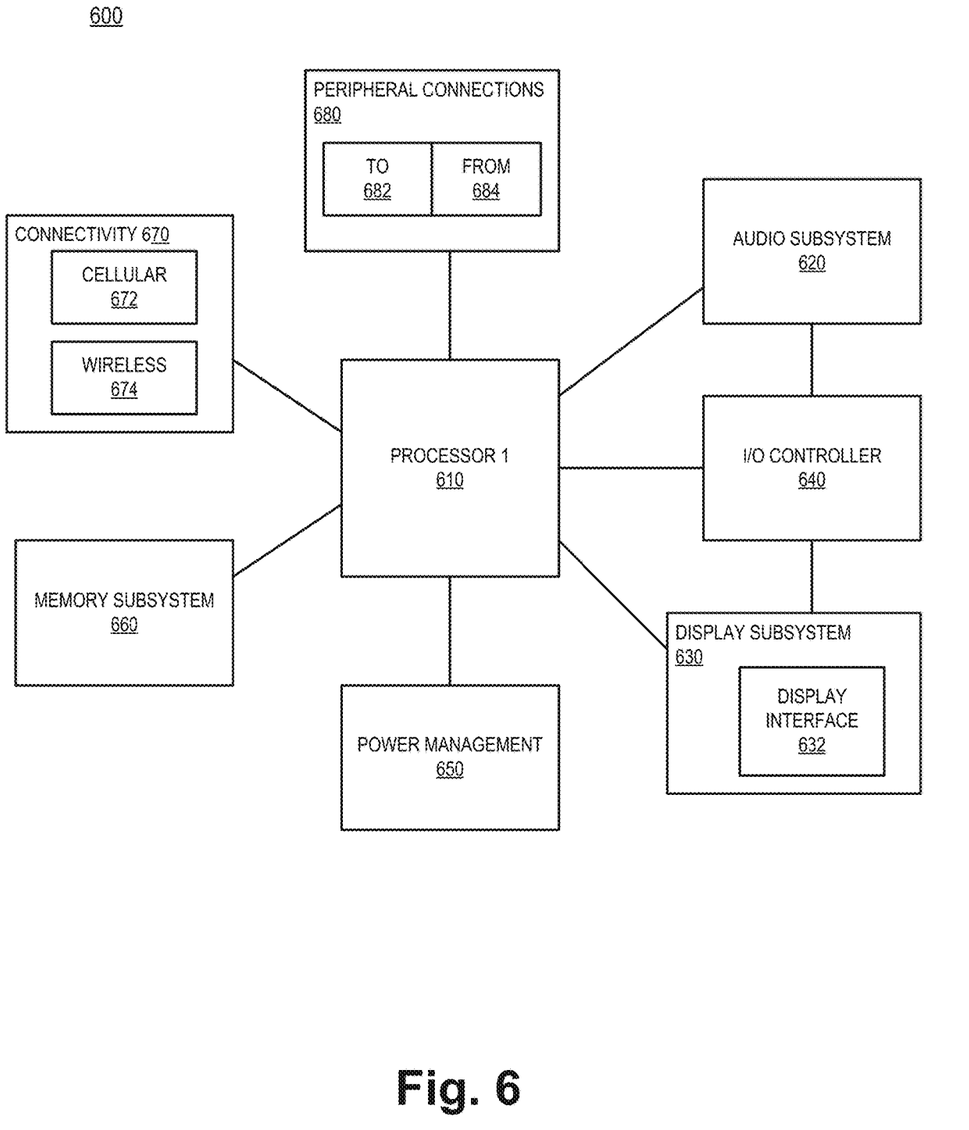
FIG. 6 illustrates a smart device or a computer system or a SoC (System-on-Chip) which includes integrated thin film capacitors on a glass core substrate, according to some embodiments.

FIG. 6 illustrates a smart device or a computer system or a SoC (System-on-Chip) which includes integrated thin film capacitors on a glass core substrate, according to some embodiments. In some embodiments, computing device 600 represents a mobile computing device, such as a computing tablet, a mobile phone or smart-phone, a wireless-enabled e-reader, or other wireless mobile device. It will be understood that certain components are shown generally, and not all components of such a device are shown in computing device 600. In some embodiments, one or more components of computing device 600, for example processor 610 or I/O controller 640, include packages with thin film capacitors on a glass core substrate as described above.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, etc., may be used without departing from the scope of the disclosure.

In some embodiments, computing device 600 includes a first processor 610. The various embodiments of the present disclosure may also comprise a network interface within 670 such as a wireless interface so that a system embodiment may be incorporated into a wireless device, for example, cell phone or personal digital assistant.

In one embodiment, processor 610 can include one or more physical devices, such as microprocessors, application processors, microcontrollers, programmable logic devices, or other processing means. The processing operations performed by processor 610 include the execution of an operating platform or operating system on which applications and/or device functions are executed. The processing operations include operations related to I/O (input/output) with a human user or with other devices, operations related to power management, and/or operations related to connecting the computing device 600 to another device. The processing operations may also include operations related to audio I/O and/or display I/O.

In one embodiment, computing device 600 includes audio subsystem 620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 600, or connected to the computing device 600. In one embodiment, a user interacts with the computing device 600 by providing audio commands that are received and processed by processor 610.

Display subsystem 630 represents hardware (e.g., display devices) and software (e.g., drivers) components that provide a visual and/or tactile display for a user to interact with the computing device 600. Display subsystem 630 includes display interface 632, which includes the particular screen or hardware device used to provide a display to a user. In one embodiment, display interface 632 includes logic separate from processor 610 to perform at least some processing related to the display. In one embodiment, display subsystem 630 includes a touch screen (or touch pad) device that provides both output and input to a user.

I/O controller 640 represents hardware devices and software components related to interaction with a user. I/O controller 640 is operable to manage hardware that is part of audio subsystem 620 and/or display subsystem 630. Additionally, I/O controller 640 illustrates a connection point for additional devices that connect to computing device 600 through which a user might interact with the system. For example, devices that can be attached to the computing device 600 might include microphone devices, speaker or stereo systems, video systems or other display devices, keyboard or keypad devices, or other I/O devices for use with specific applications such as card readers or other devices.

As mentioned above, I/O controller 640 can interact with audio subsystem 620 and/or display subsystem 630. For example, input through a microphone or other audio device can provide input or commands for one or more applications or functions of the computing device 600. Additionally, audio output can be provided instead of, or in addition to display output. In another example, if display subsystem 630 includes a touch screen, the display device also acts as an input device, which can be at least partially managed by I/O controller 640. There can also be additional buttons or switches on the computing device 600 to provide I/O functions managed by I/O controller 640.

In one embodiment, I/O controller 640 manages devices such as accelerometers, cameras, light sensors or other environmental sensors, or other hardware that can be included in the computing device 600. The input can be part of direct user interaction, as well as providing environmental input to the system to influence its operations (such as filtering for noise, adjusting displays for brightness detection, applying a flash for a camera, or other features).

In one embodiment, computing device 600 includes power management 650 that manages battery power usage, charging of the battery, and features related to power saving operation. Memory subsystem 660 includes memory devices for storing information in computing device 600. Memory can include nonvolatile (state does not change if power to the memory device is interrupted) and/or volatile (state is indeterminate if power to the memory device is interrupted) memory devices. Memory subsystem 660 can store application data, user data, music, photos, documents, or other data, as well as system data (whether long-term or temporary) related to the execution of the applications and functions of the computing device 600.

Elements of embodiments are also provided as a machine-readable medium (e.g., memory 660) for storing the computer-executable instructions. The machine-readable medium (e.g., memory 660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 670 includes hardware devices (e.g., wireless and/or wired connectors and communication hardware) and software components (e.g., drivers, protocol stacks) to enable the computing device 600 to communicate with external devices. The computing device 600 could be separate devices, such as other computing devices, wireless access points or base stations, as well as peripherals such as headsets, printers, or other devices.

Connectivity 670 can include multiple different types of connectivity. To generalize, the computing device 600 is illustrated with cellular connectivity 672 and wireless connectivity 674. Cellular connectivity 672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 680 include hardware interfaces and connectors, as well as software components (e.g., drivers, protocol stacks) to make peripheral connections. It will be understood that the computing device 600 could both be a peripheral device ("to" 682) to other computing devices, as well as have peripheral devices ("from" 684) connected to it. The computing device 600 commonly has a "docking" connector to connect to other computing devices for purposes such as managing (e.g., downloading and/or uploading, changing, synchronizing) content on computing device 600. Additionally, a docking connector can allow computing device 600 to connect to certain peripherals that allow the computing device 600 to control content output, for example, to audiovisual or other systems.

In addition to a proprietary docking connector or other proprietary connection hardware, the computing device 600 can make peripheral connections 680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

In one example, a package substrate is provided comprising: one or more first conductive contacts on a first substrate surface; one or more second conductive contacts on a second substrate surface opposite the first substrate surface; a core layer comprising glass between the first and the second substrate surfaces; and one or more thin film capacitors on the glass core conductively coupled with one of the first conductive contacts and one of the second conductive contacts, wherein the thin film capacitor comprises a first metal layer on a surface of the glass core, a thin film dielectric material on a surface of the first metal layer, and a second metal layer on a surface of the thin film dielectric material.

In some embodiments, the thin film dielectric material extends over one side of the first metal layer, the thin film dielectric material contacting the surface of the glass core. In some embodiments, the first metal layer extends laterally further than the thin film dielectric material in one direction. In some embodiments, the surface of the glass core comprises a first glass core surface and further comprising one or more thin film capacitors on a second glass core surface opposite the first glass core surface. Some embodiments also include interlayer dielectric covering the one or more thin film capacitors on the first glass core surface. In some embodiments, the one or more thin film capacitors on the second glass core surface are coplanar with the one or more first conductive contacts, the one or more first conductive contacts to couple with an integrated circuit device. In some embodiments, the one or more thin film capacitors on the second glass core surface are coplanar with the one or more second conductive contacts, the one or more second conductive contacts to couple with a system board. Some embodiments also include interlayer dielectric covering the one or more thin film capacitors on the second glass core surface.

In another example, a system is provided comprising: a processor; a communication interface; and an integrated circuit device package, the integrated circuit device package comprising: an integrated circuit device coupled with one or more first conductive contacts on a first substrate surface; one or more second conductive contacts on a second substrate surface opposite the first substrate surface; a core layer comprising glass between the first and the second substrate surfaces; and one or more thin film capacitors on the glass core conductively coupled with one of the first conductive contacts and one of the second conductive contacts, wherein the thin film capacitor comprises a first metal layer on a surface of the glass core, a thin film dielectric material on a surface of the first metal layer, and a second metal layer on a surface of the thin film dielectric material, and wherein the first metal layer extends laterally further than the thin film dielectric material in one direction.

In some embodiments, the first metal layer contacts a conductive via through the glass core. In some embodiments, the first metal layer comprises nickel, tungsten, titanium, or chromium. In some embodiments, second metal layer comprises a metal different from the first metal layer. In some embodiments, the glass core has a thickness of less than 1 mm. In some embodiments, the thin film dielectric material has a thickness of less than 1 um. In some embodiments, the thin film dielectric material comprises a ferroelectric dielectric. In some embodiments, the thin film dielectric material comprises a first thin film dielectric layer, and further comprising the thin film capacitor having a second thin film dielectric layer between metal layers.

In another example, a method of manufacturing a package substrate is provided comprising: forming a first metal layer over a glass surface; forming a thin film layer over the first metal layer; forming a second metal layer over the thin film layer; and forming separate interconnects with the first and second metal layers.

In some embodiments, forming a first metal layer over a glass surface comprises forming the first metal layer in contact with a conductive via through the glass. Some embodiments also include forming dielectric build-up material over the second metal layer. In some embodiments, the thin film layer comprises a first thin film layer, and further comprising: forming a second thin film layer over the second metal layer, and forming a third metal layer over the second thin film layer. Some embodiments also include forming conductive contacts to couple with an integrated circuit device on the glass surface. In some embodiments, the thin film layer comprises a thin film ferroelectric material. In some embodiments, forming the thin film ferroelectric material comprises: applying a paste over the first metal layer; and annealing the paste at high temperature. In some embodiments, forming the thin film ferroelectric material comprises forming a layer having a thickness of less than 1 um.

In another example, an integrated circuit device package is provided comprising: an integrated circuit device coupled with one or more first conductive contacts on a first substrate surface; one or more second conductive contacts on a second substrate surface opposite the first substrate surface; a core layer comprising glass between the first and the second substrate surfaces; and one or more thin film capacitors on the glass core conductively coupled with one of the first conductive contacts and one of the second conductive contacts, wherein the thin film capacitor comprises a first metal layer on a surface of the glass core, a thin film dielectric material on a surface of the first metal layer, and a second metal layer on a surface of the thin film dielectric material, and wherein the first metal layer extends laterally further than the thin film dielectric material in one direction.

In some embodiments, the thin film dielectric material extends over one side of the first metal layer, the thin film dielectric material contacting the surface of the glass core. In some embodiments, the first metal layer contacts a conductive via through the glass core. In some embodiments, the first metal layer extends laterally further than the thin film dielectric material in one direction. In some embodiments, the first metal layer comprises nickel, tungsten, titanium, or chromium. In some embodiments, the surface of the glass core comprises a first glass core surface and further comprising one or more thin film capacitors on a second glass core surface opposite the first glass core surface. In some embodiments, the thin film dielectric material comprises a ferroelectric dielectric. In some embodiments, the thin film dielectric material comprises a first thin film dielectric layer, and further comprising the thin film capacitor having a second thin film dielectric layer between metal layers.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. A package substrate comprising:
   one or more first conductive contacts on a first substrate surface;
   one or more second conductive contacts on a second substrate surface opposite the first substrate surface;
   a core layer comprising glass between the first and the second substrate surfaces; and
   one or more thin film capacitors on the glass core conductively coupled with one of the first conductive contacts and one of the second conductive contacts, wherein the thin film capacitor comprises a first metal layer on a surface of the glass core, a thin film dielectric material on a surface of the first metal layer, and a second metal layer on a surface of the thin film dielectric material, wherein the thin film dielectric material extends over two sides of both the first and the second metal layers, the thin film dielectric material contacting the surface of the glass core, and wherein the first and second metal layers are coupled with separate first conductive contacts on the first substrate surface, wherein the surface of the glass core comprises a first glass core surface and further comprising the one or more thin film capacitors on a second glass core surface opposite the first glass core surface, further comprising an interlayer dielectric covering the one or more thin film capacitors on the surface of the glass core, and wherein the one or more thin film capacitors on the surface of the glass core are coplanar with the one or more first conductive contacts, the one or more first conductive contacts to couple with an integrated circuit device.

2. The package substrate of claim 1, wherein the first metal layer extends laterally further than the thin film dielectric material in one direction.

3. The package substrate of claim 1, wherein the one or more thin film capacitors on the second glass core surface are coplanar with the one or more second conductive contacts, the one or more second conductive contacts to couple with a system board.

4. The package substrate of claim 1, further comprising the interlayer dielectric covering the one or more thin film capacitors on the second glass core surface.

5. A system comprising:
   a processor;
   a communication interface; and
   an integrated circuit device package, the integrated circuit device package comprising:

an integrated circuit device coupled with one or more first conductive contacts on a first substrate surface;

one or more second conductive contacts on a second substrate surface opposite the first substrate surface;

a core layer comprising glass between the first and the second substrate surfaces; and one or more thin film capacitors on the glass core conductively coupled with one of the first conductive contacts and one of the second conductive contacts, wherein the thin film capacitor comprises a first metal layer on a surface of the glass core, a thin film dielectric material on a surface of the first metal layer, and a second metal layer on a surface of the thin film dielectric material, wherein the thin film dielectric material extends over two sides of both the first and the second metal layers, the thin film dielectric material contacting the surface of the glass core, wherein the first metal layer extends laterally further than the thin film dielectric material in one direction, and wherein the first and second metal layers are coupled with separate first conductive contacts on the first substrate surface, wherein the surface of the glass core comprises a first glass core surface and further comprising one or more thin film capacitors on a second glass core surface opposite the first glass core surface, further comprising an interlayer dielectric covering the one or more thin film capacitors on the surface of the glass core, and wherein the one or more thin film capacitors on the surface of the glass core are coplanar with the one or more first conductive contacts.

6. The system of claim 5, wherein the first metal layer contacts a conductive via through the glass core.

7. The system of claim 5, wherein the first metal layer comprises nickel, tungsten, titanium, or chromium.

8. The system of claim 7, wherein the second metal layer comprises a metal different from the first metal layer.

9. The system of claim 5, wherein the glass core has a thickness of less than 1 mm.

10. The system of claim 5, wherein the thin film dielectric material has a thickness of less than 1 um.

11. The system of claim 5, wherein the thin film dielectric material comprises a ferroelectric dielectric.

12. The system of claim 5, wherein the thin film dielectric material comprises a first thin film dielectric layer, and further comprising the thin film capacitor having a second thin film dielectric layer between metal layers.

* * * * *